US012281385B2

(12) United States Patent
Cheng et al.

(10) Patent No.: US 12,281,385 B2
(45) Date of Patent: Apr. 22, 2025

(54) GAS DISPENSER AND DEPOSITION APPARATUS USING THE SAME

(71) Applicant: TAIWAN SEMICONDUCTOR MANUFACTURING CO., LTD., Hsinchu (TW)

(72) Inventors: Chung-Liang Cheng, Changhua (TW); Wei Zhang, Chupei (TW); Ching-Chia Wu, Taichung (TW); Wei-Jen Chen, Taichung (TW); Yen-Yu Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 335 days.

(21) Appl. No.: 14/739,355

(22) Filed: Jun. 15, 2015

(65) Prior Publication Data

US 2016/0362782 A1    Dec. 15, 2016

(51) Int. Cl.
  *C23C 16/44*   (2006.01)
  *C23C 16/455*  (2006.01)
  *C23C 16/509*  (2006.01)

(52) U.S. Cl.
  CPC ...... *C23C 16/4404* (2013.01); *C23C 16/4405* (2013.01); *C23C 16/4408* (2013.01); *C23C 16/45565* (2013.01); *C23C 16/5096* (2013.01)

(58) Field of Classification Search
  CPC ....... B01J 2219/0204; B01J 2219/0263; C03C 2204/04; C04B 2237/343; C04B 2237/366; C04B 35/581; C04B 35/62665; C04B 41/4527; C04B 41/4558; C04B 41/4842; C04B 41/5032; H01L 33/0062; H01L 21/67011; H01L 21/6831; H01L 21/68757; C23C 16/0272; C23C 16/405; C23C 16/4404; C23C 16/4405–4408; C23C 16/45565; C23C 16/5096; C23C 18/1208; C23C 26/00; C23C 28/04; C23C 28/44;
(Continued)

(56) References Cited

U.S. PATENT DOCUMENTS 2,847,884 A * 8/1958 Favre ............... B23B 51/102
  408/26
4,022,928 A * 5/1977 Piwcyzk ............. C23C 14/12
  430/296
(Continued)

FOREIGN PATENT DOCUMENTS

EP    1344752 A1 *  9/2003  ............. C03C 3/085
JP    2014220398 A * 11/2014  ........... H01J 37/3244
TW     588402 B  *  4/2005  ....... H01L 21/67069

OTHER PUBLICATIONS

R. L. Puurunen. "Surface Chemistry of Atomic Layer Deposition: A Case Study for the Trimethylaluminum/Water Process." Journal of Applied Physics 97 (2005) 121301. pp. 1-52. (Year: 2005).*
(Continued)

*Primary Examiner* — Jeffrie R Lund
(74) *Attorney, Agent, or Firm* — Maschoff Brennan

(57) ABSTRACT

A gas dispenser utilized in a deposition apparatus is provided. The gas dispenser includes a showerhead comprising a plurality of holes, and a mask layer formed on a surface of the showerhead, wherein the holes penetrate through the mask layer. A deposition apparatus using the gas dispenser is also disclosed.

20 Claims, 3 Drawing Sheets

(58) Field of Classification Search
CPC .. C23C 4/00; C23C 4/10; C23C 4/134; C30B 25/08; C30B 29/406; H01J 37/32467; H01J 37/32477; H01J 37/32495; H01J 37/3255; H01J 37/32559; H01J 37/3426
See application file for complete search history.

(56) References Cited

U.S. PATENT DOCUMENTS

| | | | | | |
|---|---|---|---|---|---|
| 4,816,098 | A | * | 3/1989 | Davis | H01L 21/67748 118/728 |
| 4,818,327 | A | * | 4/1989 | Davis | H01L 21/67115 118/620 |
| 4,875,989 | A | * | 10/1989 | Davis | G03F 7/168 204/298.33 |
| 4,972,119 | A | * | 11/1990 | Kariya | H01J 9/323 313/624 |
| 5,069,938 | A | * | 12/1991 | Lorimer | C23C 8/34 427/255.26 |
| 5,119,760 | A | * | 6/1992 | McMillan | C23C 16/4412 118/722 |
| 5,132,003 | A | * | 7/1992 | Mitani | C25D 11/06 205/174 |
| 5,138,520 | A | * | 8/1992 | McMillan | C23C 16/4412 361/311 |
| 5,439,524 | A | * | 8/1995 | Cain | C23C 16/45565 118/715 |
| 5,494,713 | A | * | 2/1996 | Ootuki | C23C 8/36 118/723 R |
| 5,540,800 | A | * | 7/1996 | Qian | C23C 16/507 156/345.48 |
| 5,614,252 | A | * | 3/1997 | McMillan | H01L 21/02205 427/458 |
| 5,688,565 | A | * | 11/1997 | McMillan | H01C 7/1013 427/565 |
| 5,730,801 | A | * | 3/1998 | Tepman | H01L 21/67751 156/345.31 |
| 5,759,923 | A | * | 6/1998 | McMillan | H01L 21/02205 438/788 |
| 5,871,805 | A | * | 2/1999 | Lemelson | C23C 16/52 427/8 |
| 5,961,726 | A | * | 10/1999 | Aoike | H01J 37/32082 118/723 E |
| 5,962,085 | A | * | 10/1999 | Hayashi | C23C 18/1287 427/585 |
| 5,985,375 | A | * | 11/1999 | Donohoe | C23C 16/515 427/248.1 |
| 5,993,916 | A | * | 11/1999 | Zhao | C23C 16/4411 117/104 |
| 6,027,629 | A | * | 2/2000 | Hisamoto | B01J 3/006 205/50 |
| 6,035,101 | A | * | 3/2000 | Sajoto | C23C 16/4586 118/728 |
| 6,054,013 | A | * | 4/2000 | Collins | H01J 37/321 118/723 I |
| 6,056,994 | A | * | 5/2000 | Paz de Araujo | B05D 3/0493 427/554 |
| 6,077,384 | A | * | 6/2000 | Collins | A21D 2/185 118/723 I |
| 6,110,531 | A | * | 8/2000 | Paz de Araujo | B05D 1/00 427/255.25 |
| 6,132,518 | A | * | 10/2000 | Milinkovic | C23C 16/16 118/715 |
| 6,379,575 | B1 | * | 4/2002 | Yin | B08B 7/0035 134/1.1 |
| 6,383,555 | B1 | * | 5/2002 | Hayashi | H01L 41/314 427/96.7 |
| 6,383,964 | B1 | * | 5/2002 | Nakahara | C04B 35/18 501/127 |
| 6,429,172 | B1 | * | 8/2002 | Tsukada | C01F 7/141 423/628 |
| 6,432,259 | B1 | * | 8/2002 | Noorbakhsh | H01J 37/321 118/723 E |
| 6,444,083 | B1 | * | 9/2002 | Steger | C23C 18/36 118/715 |
| 6,451,184 | B1 | * | 9/2002 | Sone | C23C 14/0057 204/298.11 |
| 6,465,374 | B1 | * | 10/2002 | Butterbaugh | C23C 16/481 257/E21.226 |
| 6,466,881 | B1 | * | 10/2002 | Shih | C23C 14/564 702/127 |
| 6,530,340 | B2 | * | 3/2003 | You | H01L 21/6715 118/320 |
| 6,592,707 | B2 | * | 7/2003 | Shih | C09D 4/00 118/715 |
| 6,620,289 | B1 | * | 9/2003 | Yan | C23C 16/455 118/715 |
| 6,846,745 | B1 | * | 1/2005 | Papasouliotis | C23C 16/045 257/E21.268 |
| 7,094,316 | B1 | * | 8/2006 | Hanawa | H01J 37/32082 118/723 I |
| 7,156,921 | B2 | * | 1/2007 | Byun | B82Y 10/00 118/50 |
| 8,629,423 | B1 | * | 1/2014 | Kislov | H01L 21/3065 156/345.24 |
| 2001/0001407 | A1 | * | 5/2001 | You | H01L 21/6715 156/181 |
| 2001/0003271 | A1 | * | 6/2001 | Otsuki | C23C 16/4404 118/723 I |
| 2001/0006070 | A1 | * | 7/2001 | Shang | C23C 16/4404 134/1 |
| 2001/0020516 | A1 | * | 9/2001 | Khan | H01L 21/3065 156/345.24 |
| 2001/0029891 | A1 | * | 10/2001 | Oh | C23C 16/403 118/722 |
| 2001/0051439 | A1 | * | 12/2001 | Khan | H01L 21/3065 438/710 |
| 2002/0000198 | A1 | * | 1/2002 | Ishikawa | C23C 16/4405 118/724 |
| 2002/0016044 | A1 | * | 2/2002 | Dreybrodt | C23C 16/0272 438/305 |
| 2002/0045966 | A1 | * | 4/2002 | Lee | B08B 7/00 700/121 |
| 2002/0084352 | A1 | * | 7/2002 | Chen | C23C 16/45565 239/390 |
| 2002/0086501 | A1 | * | 7/2002 | O'Donnell | B01J 19/0073 438/481 |
| 2002/0086553 | A1 | * | 7/2002 | O'Donnell | B01J 19/02 438/761 |
| 2002/0094378 | A1 | * | 7/2002 | O'Donnell | B01J 19/02 427/249.1 |
| 2003/0000545 | A1 | * | 1/2003 | Fitzsimmons | B08B 7/00 134/1.1 |
| 2003/0010446 | A1 | * | 1/2003 | Kajiyama | C23C 16/4404 156/345.1 |
| 2003/0077388 | A1 | * | 4/2003 | Byun | C23C 16/45591 427/255.28 |
| 2003/0150530 | A1 | * | 8/2003 | Lin | C25D 11/045 148/518 |
| 2003/0205479 | A1 | * | 11/2003 | Lin | C25D 11/04 205/153 |
| 2004/0018304 | A1 | * | 1/2004 | Chung | C23C 16/34 427/250 |
| 2004/0058070 | A1 | * | 3/2004 | Takeuchi | C23C 4/01 427/282 |
| 2004/0060658 | A1 | * | 4/2004 | Nishimoto | H01J 37/32623 156/345.1 |
| 2004/0060661 | A1 | * | 4/2004 | Nishimoto | C23C 16/4404 156/345.43 |
| 2004/0061447 | A1 | * | 4/2004 | Saigusa | H01J 37/32009 315/111.21 |
| 2004/0063333 | A1 | * | 4/2004 | Saigusa | H01J 37/32431 438/758 |
| 2004/0124280 | A1 | * | 7/2004 | Shih | H01J 37/3244 239/548 |
| 2004/0151926 | A1 | * | 8/2004 | Wada | C25D 11/04 428/472 |
| 2004/0163669 | A1 | * | 8/2004 | Brueckner | B24C 1/06 134/1.2 |

(56) References Cited

U.S. PATENT DOCUMENTS

| | | | | |
|---|---|---|---|---|
| 2004/0182417 A1* | 9/2004 | Hamelin | C23C 16/4405 | 134/1.3 |
| 2004/0200417 A1* | 10/2004 | Hanawa | H01J 37/32357 | 118/723 I |
| 2004/0206305 A1* | 10/2004 | Choi | C23C 16/45565 | 118/715 |
| 2004/0211674 A1* | 10/2004 | Tzeng | C25D 11/04 | 205/324 |
| 2004/0263827 A1* | 12/2004 | Xu | G01N 21/68 | 356/72 |
| 2005/0054198 A1* | 3/2005 | Um | C23C 16/45565 | 438/689 |
| 2005/0056218 A1* | 3/2005 | Sun | C04B 41/91 | 118/715 |
| 2005/0136604 A1* | 6/2005 | Al-Bayati | H01L 29/66795 | 438/301 |
| 2005/0156063 A1* | 7/2005 | Tsuji | C23C 16/401 | 239/548 |
| 2005/0181617 A1* | 8/2005 | Bosch | C04B 41/0054 | 438/710 |
| 2005/0251990 A1* | 11/2005 | Choi | H01J 37/3244 | 29/558 |
| 2005/0255257 A1* | 11/2005 | Choi | H01L 21/0217 | 427/585 |
| 2005/0268852 A1* | 12/2005 | Hatanaka | C23C 16/45525 | 118/723 VE |
| 2006/0001848 A1* | 1/2006 | Hwang | H01J 37/32449 | 355/53 |
| 2006/0027249 A1* | 2/2006 | Johnson | C23C 16/4405 | 134/1.1 |
| 2006/0060138 A1* | 3/2006 | Keller | H01J 37/3244 | 118/715 |
| 2006/0073354 A1* | 4/2006 | Watanabe | H01J 37/32495 | 428/596 |
| 2006/0099457 A1* | 5/2006 | Moriya | C23C 16/4404 | 428/701 |
| 2006/0124151 A1* | 6/2006 | Yamasaki | C23C 16/4405 | 134/1.1 |
| 2006/0159940 A1* | 7/2006 | Bhatnagar | C23C 14/081 | 428/472 |
| 2006/0183344 A1* | 8/2006 | Escher | C23C 16/40 | 438/771 |
| 2006/0185592 A1* | 8/2006 | Matsuura | H01L 21/31116 | 118/715 |
| 2006/0219360 A1* | 10/2006 | Iwasaki | G05D 23/1902 | 156/345.27 |
| 2006/0228496 A1* | 10/2006 | Choi | H01J 37/3244 | 427/569 |
| 2006/0228889 A1* | 10/2006 | Edelberg | H01L 21/31138 | 438/689 |
| 2006/0263522 A1* | 11/2006 | Byun | C23C 16/45565 | 427/248.1 |
| 2006/0275546 A1* | 12/2006 | Arena | C23C 16/46 | 156/345.33 |
| 2007/0022952 A1* | 2/2007 | Ritchie | C23C 14/165 | 118/715 |
| 2007/0023144 A1* | 2/2007 | Lee | C23C 14/165 | 156/345.33 |
| 2007/0049053 A1* | 3/2007 | Mahajani | H01L 21/3141 | 438/785 |
| 2007/0068629 A1* | 3/2007 | Shih | H01L 21/3065 | 156/345.34 |
| 2007/0077737 A1* | 4/2007 | Kobayashi | C23C 16/26 | 438/513 |
| 2007/0096658 A1* | 5/2007 | Saigusa | H01J 37/32009 | 315/111.21 |
| 2007/0107749 A1* | 5/2007 | Sin | H01J 37/32862 | 134/1.1 |
| 2007/0119546 A1* | 5/2007 | Collins | H01J 37/32082 | 156/345.48 |
| 2007/0175861 A1* | 8/2007 | Hwang | H01J 37/3244 | 216/67 |
| 2007/0202694 A1* | 8/2007 | Seo | C23C 16/4405 | 438/654 |
| 2007/0207275 A1* | 9/2007 | Nowak | B08B 7/0035 | 427/569 |
| 2007/0247073 A1* | 10/2007 | Paterson | H01J 37/32091 | 315/111.21 |
| 2007/0261639 A1* | 11/2007 | Morioka | C23C 16/507 | 118/715 |
| 2008/0026597 A1* | 1/2008 | Munro | C23C 16/401 | 438/788 |
| 2008/0029032 A1* | 2/2008 | Sun | H01L 21/6833 | 118/728 |
| 2008/0044593 A1* | 2/2008 | Seo | C23C 16/08 | 427/569 |
| 2008/0070056 A1* | 3/2008 | Hatanaka | C25D 11/045 | 428/593 |
| 2008/0107825 A1* | 5/2008 | Ishizaka | C23C 16/4404 | 427/578 |
| 2008/0194169 A1* | 8/2008 | Sterling | H01L 21/68785 | 445/73 |
| 2008/0216302 A1* | 9/2008 | Cheung | C23C 18/1212 | 29/458 |
| 2008/0216958 A1* | 9/2008 | Goto | C23C 16/4404 | 156/345.35 |
| 2009/0017227 A1* | 1/2009 | Fu | C23C 16/0245 | 427/569 |
| 2009/0023302 A1* | 1/2009 | Kuznetsov | C23C 16/4404 | 438/800 |
| 2009/0029528 A1* | 1/2009 | Sanchez | H01L 21/67069 | 438/476 |
| 2009/0117270 A1* | 5/2009 | Yamasaki | C23C 16/0227 | 427/248.1 |
| 2009/0142513 A1* | 6/2009 | Murakami | C23C 16/08 | 427/576 |
| 2009/0148704 A1* | 6/2009 | Takasuka | H01J 37/32449 | 428/411.1 |
| 2009/0163037 A1* | 6/2009 | Miya | H01L 21/31645 | 257/E21.24 |
| 2009/0194233 A1* | 8/2009 | Tamura | C23C 16/4404 | 156/345.1 |
| 2009/0218212 A1* | 9/2009 | Denpoh | C23C 16/50 | 204/164 |
| 2009/0277587 A1* | 11/2009 | Lubomirsky | C23C 16/4405 | 156/345.34 |
| 2009/0280650 A1* | 11/2009 | Lubomirsky | B08B 7/00 | 438/694 |
| 2009/0302002 A1* | 12/2009 | Collins | H01J 37/321 | 216/67 |
| 2010/0003406 A1* | 1/2010 | Lam | C23C 16/4412 | 427/255.391 |
| 2010/0028572 A1* | 2/2010 | Kobayashi | C23C 26/00 | 428/34.1 |
| 2010/0048028 A1* | 2/2010 | Rasheed | C23C 16/4404 | 438/758 |
| 2010/0098884 A1* | 4/2010 | Balseanu | C23C 16/0272 | 427/577 |
| 2010/0173496 A1* | 7/2010 | Zhong | H01L 21/02323 | 438/696 |
| 2010/0180819 A1* | 7/2010 | Hatanaka | C23C 16/30 | 118/719 |
| 2010/0190352 A1* | 7/2010 | Jaiswal | C23C 16/4404 | 438/758 |
| 2010/0260947 A1* | 10/2010 | Minami | H01J 37/32091 | 427/569 |
| 2010/0273290 A1* | 10/2010 | Kryliouk | C23C 16/303 | 438/99 |
| 2010/0273291 A1* | 10/2010 | Kryliouk | C23C 16/303 | 438/99 |
| 2010/0307579 A1* | 12/2010 | Sheng | H01L 31/056 | 136/256 |
| 2010/0314005 A1* | 12/2010 | Saito | C23C 8/26 | 148/318 |
| 2011/0033966 A1* | 2/2011 | Su | C23C 16/303 | 438/47 |
| 2011/0045676 A1* | 2/2011 | Park | C23C 16/401 | 438/771 |

(56) References Cited

U.S. PATENT DOCUMENTS

| | | | | |
|---|---|---|---|---|
| 2011/0059600 A1* | 3/2011 | Sakai | H01L 21/67028 | 438/584 |
| 2011/0061812 A1* | 3/2011 | Ganguly | H01L 21/67109 | 156/345.34 |
| 2011/0070740 A1* | 3/2011 | Bettencourt | H01J 37/3244 | 438/710 |
| 2011/0076401 A1* | 3/2011 | Chao | C23C 16/325 | 427/249.16 |
| 2011/0111128 A1* | 5/2011 | Park | C23C 16/45565 | 427/307 |
| 2011/0117728 A1* | 5/2011 | Su | H01L 21/67115 | 134/4 |
| 2011/0136346 A1* | 6/2011 | Geissbuhler | H01J 37/32357 | 438/710 |
| 2011/0226734 A1* | 9/2011 | Sumiya | H01J 37/32192 | 216/41 |
| 2011/0263103 A1* | 10/2011 | Sanchez | H01L 21/67069 | 438/478 |
| 2011/0283942 A1* | 11/2011 | Iwata | C23C 16/46 | 118/725 |
| 2011/0318888 A1* | 12/2011 | Komatsu | C23C 16/0272 | 438/157 |
| 2012/0037596 A1* | 2/2012 | Eto | H01J 37/3244 | 216/67 |
| 2012/0039680 A1* | 2/2012 | Koike | B23B 51/02 | 408/1 R |
| 2012/0040132 A1* | 2/2012 | Eto | B32B 15/016 | 428/131 |
| 2012/0052280 A1* | 3/2012 | Chang | C23C 14/0664 | 428/220 |
| 2012/0103524 A1* | 5/2012 | Chebi | H01J 37/3211 | 156/345.48 |
| 2012/0108072 A1* | 5/2012 | Angelov | C23C 16/45565 | 438/712 |
| 2012/0152900 A1* | 6/2012 | Chebi | H01J 37/3244 | 315/111.21 |
| 2012/0208371 A1* | 8/2012 | Rogers | H01J 37/321 | 438/758 |
| 2012/0234945 A1* | 9/2012 | Olgado | C23C 16/45565 | 239/589 |
| 2012/0244385 A1* | 9/2012 | Hsu | C23C 10/02 | 428/656 |
| 2012/0247667 A1* | 10/2012 | Hashiguchi | H01J 37/32477 | 156/345.3 |
| 2012/0247673 A1* | 10/2012 | Hayashi | C23C 16/503 | 156/345.33 |
| 2012/0270384 A1* | 10/2012 | Sanchez | C23C 16/45563 | 438/503 |
| 2012/0318457 A1* | 12/2012 | Nguyen | C30B 25/14 | 156/345.34 |
| 2013/0023062 A1* | 1/2013 | Masuda | C23C 16/45565 | 438/3 |
| 2013/0068320 A1* | 3/2013 | Nguyen | F16L 53/00 | 137/334 |
| 2013/0109159 A1* | 5/2013 | Carlson | C23C 16/45574 | 438/503 |
| 2013/0168020 A1* | 7/2013 | Hashiguchi | H01L 21/67748 | 118/728 |
| 2013/0260566 A1* | 10/2013 | Yamazaki | C23C 16/45546 | 134/22.18 |
| 2013/0273313 A1* | 10/2013 | Sun | C03C 17/23 | 428/137 |
| 2013/0284087 A1* | 10/2013 | Gytri | H01L 21/67751 | 156/345.31 |
| 2013/0284373 A1* | 10/2013 | Sun | C23F 1/08 | 156/345.34 |
| 2013/0334344 A1* | 12/2013 | Leeser | H01J 37/32091 | 239/548 |
| 2014/0026816 A1* | 1/2014 | Myo | C23C 16/45572 | 118/728 |
| 2014/0053866 A1* | 2/2014 | Baluja | H01L 21/3065 | 438/710 |
| 2014/0056794 A1* | 2/2014 | Mori | B01J 41/14 | 423/241 |
| 2014/0099794 A1* | 4/2014 | Ingle | G01N 21/68 | 356/72 |
| 2014/0118751 A1* | 5/2014 | Rajagopalan | H01L 21/00 | 356/630 |
| 2014/0159325 A1* | 6/2014 | Parkhe | H01L 21/67109 | 279/128 |
| 2014/0231251 A1* | 8/2014 | Hashiguchi | C23C 16/45565 | 204/298.33 |
| 2014/0235069 A1* | 8/2014 | Breiling | F28F 3/02 | 438/778 |
| 2014/0272341 A1* | 9/2014 | Duan | H01J 37/32477 | 428/212 |
| 2014/0272459 A1* | 9/2014 | Daugherty | C22C 21/08 | 428/654 |
| 2014/0295670 A1* | 10/2014 | Shih | C25D 11/026 | 438/710 |
| 2014/0335287 A1* | 11/2014 | Nagai | H01J 37/3244 | 427/569 |
| 2014/0357092 A1* | 12/2014 | Singh | H01L 21/268 | 438/798 |
| 2015/0007770 A1* | 1/2015 | Chandrasekharan | C23C 16/45572 | 118/715 |
| 2015/0099373 A1* | 4/2015 | Sano | H01J 37/32862 | 438/763 |
| 2015/0132602 A1* | 5/2015 | Sun | C25D 11/16 | 428/651 |
| 2015/0143677 A1* | 5/2015 | Sun | H01L 21/67011 | 29/25.01 |
| 2015/0206739 A1* | 7/2015 | Manna | H01L 21/0271 | 438/703 |
| 2015/0211123 A1* | 7/2015 | Glukhoy | C23C 16/4405 | 134/1.1 |
| 2015/0214009 A1* | 7/2015 | Glukhoy | H01J 37/321 | 216/67 |
| 2015/0275361 A1* | 10/2015 | Lubomirsky | C23C 16/303 | 438/99 |
| 2015/0275375 A1* | 10/2015 | Kim | H01L 21/67248 | 428/141 |
| 2015/0321964 A1* | 11/2015 | Sun | C23C 4/134 | 427/446 |
| 2015/0325417 A1* | 11/2015 | Lin | H01J 37/32009 | 438/706 |
| 2016/0016286 A1* | 1/2016 | Suh | B24C 1/00 | 451/75 |
| 2016/0104648 A1* | 4/2016 | Park | H01J 37/32119 | 438/9 |
| 2016/0163513 A1* | 6/2016 | Lubomirsky | H01L 21/3065 | 438/798 |
| 2016/0181137 A1* | 6/2016 | Lee | C23C 16/45572 | 118/728 |
| 2016/0319428 A1* | 11/2016 | Rasheed | C23C 16/45574 | 438/503 |
| 2016/0362782 A1* | 12/2016 | Cheng | C23C 16/4408 | |

OTHER PUBLICATIONS

V. Miikkulainen et al. "Crystallinity of Inorganic Films Grown by Atomic Layer Deposition: Overview and General Trends." Journal of Applied Physics 113 (2013) 021301. pp. 1-101. (Year: 2013).*

John W. Diggle et al. "Anodic Oxide Films on Aluminum." Chemical Reviews. 69 [3] 1969. pp. 365-405. (Year: 1969).*

Julie A. Henkener. "Process Specification for the Anodizing of Aluminum Alloys." NASA/JSC PRC-5006 Rev. C (incorporating MIL-A-8625F 2003). 2003. pp. 1-51. (Year: 2003).*

Satoru Inoue et al. "New Roots to Formation of Nanostructures on Glass Surface Through Anodic Oxidation of Sputtered Aluminum." Science and Technology of Advanced Materials. 4 (2003). pp. 269-276. (Year: 2003).*

Jude M. Runge et al. "Understanding Aluminum Anodic Oxide Film Formation: Improving Engineering Properties Through Microstructural Modification." XII Ebrats Brasilian Surface Treatment Meeting and

(56) References Cited

OTHER PUBLICATIONS

II Latin—American Interfinish. Sao Paulo. 2006. pp. 1-10. (Year: 2006).*

Yuki Nakamura et al. "Effect of Alumite Surface Treatments on Long-Life Fatigue Behavior of a Cast Aluminum in Rotating Bending." International Journal of Fatigue. 32 (2010). pp. 621-626. (Year: 2010).*

Jakub Kolar et al. "Effect of the Aluminium Surface Morphology on the Barrier Type Anodic Film Growth." Proceedings 7th International Conference on Nanomaterials—Research & Application (NANOCON 2015 Brno, Czech Republic). pp. 591-596. (Year: 2015).*

Yong Min Park et al. "One-Step Fabrication of Nanostructure-Covered Microstructures Using Selective Aluminum Anodization Based on Non-Uniform Electric Field." Japanese Journal of Applied Physics. 55 [06GH04] 2016. pp. 1-6. (Year: 2016).*

Sakae Tajima. "Chapter 4: Anodic Oxidation of Aluminum." in Mars G. Fontana et al. "Advances in Corrosion Science and Technology." vol. 1, 1970. Plenum Press. pp. 229-262. (Year: 1970).*

Ryushin Omasa et al. "Temperature of Aluminum Being Anodized." Proceedings of American Electroplaters and Surface Finishers Society Annual Conference and Trade Show 2002. AESF Proc. SUR/FIN 2002. pp. 199-211. (Year: 2002).*

Junya Kitamura et al. "Plasma-Erosion Properties of Ceramic Coating Prepared by Plasma Spraying." Materials Transactions, Japan Thermal Spraying Society. 47 [7] 2006. pp. 1677-1683. (Year: 2006).*

Yasuhiro Kawase et al. "Development of Barrier Anodic Oxide Al2O3 Passivations of Aluminum Alloy Surface for LSI/FPD Plasma Process Equipment." Journal of the Electrochemical Society. 154 [9] 2007. pp. C530-C539. (Year: 2007).*

Tadahiro Ohmi et al. "Science Based New Silicon Technologies Based on New Manufacturing Equipment Completely Free from Contaminations and Damages." WPI-AIMR News. 8 (2009). pp. 93-107. (Year: 2009).*

Tatsuo Sato. "Innovative Development of Aluminium Research and Technologies in Japan." Proceedings of the 12th International Conference on Aluminium Alloys, Sep. 5-9, 2010, Yokohama, Japan. PL01 (2010). pp. 1-9. (Year: 2010).*

\* cited by examiner

GAS DISPENSER AND DEPOSITION APPARATUS USING THE SAME

BACKGROUND

In recent years, the density is increased in integrated circuit technology since the minimum feature size of lithography has been reduced to below one micrometer. In the fabrication of precision via and contact opening at these reduced dimensions, there is a need to form insulating layers (inter metal dielectric (IMD), interlevel dielectric (ILD) layers) that have uniform wet etch rates so that uniform via and contact opening can be formed.

Processing chambers, such as chemical vapor deposition (CVD) chambers are used to process work pieces, such as semiconductor wafers, light crystal diodes, flat panel displays, or other similar substrates. During processing, a substrate located within the processing chamber is exposed to reactant gases introduced into the chamber and the substrate has a film deposited on it. During the processing of the substrate, the inside surfaces of the chamber itself are typically contaminated by residual deposited material. Thus, in subsequent processing of substrates within the contaminated chamber, unwanted particles may form when the reactant gases combine with the contamination on the chamber's surfaces and the particles may be deposited on the substrate and cause the film being not uniform.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
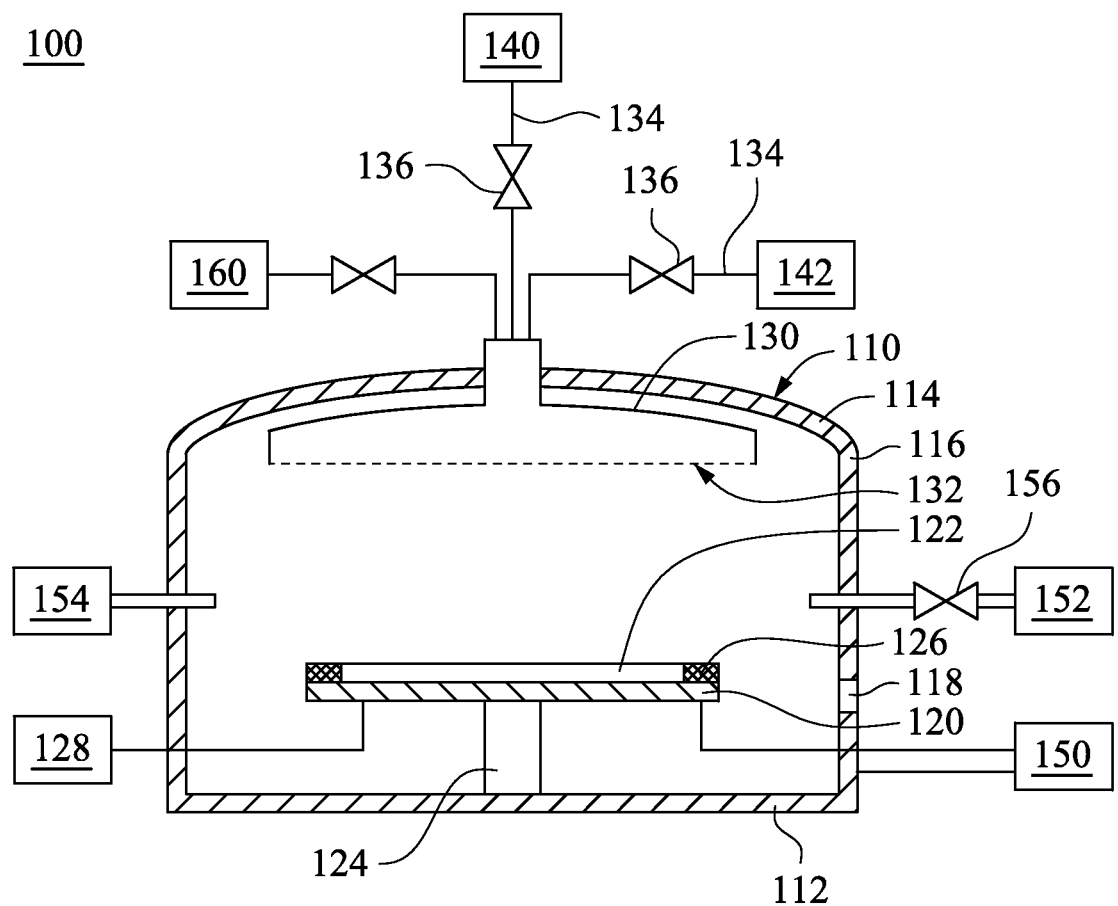
FIG. 1 is a schematic view of a deposition apparatus, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In forming multi-level integrated circuit devices, low-K (dielectric constant) an inter-metal dielectric (IMD) layers are required to reduce signal delay and power loss effects as IC devices are scaled down in size. The low-K silicon oxide based materials are formed by using chemical vapor deposition (CVD) processes, for example, plasma enhanced CVD (PECVD) processes or high density plasma CVD (HDP-CVD) processes, or by atomic layer deposition (ALD) processes to deposit the dielectric material layers.

One problem with such deposition processes is the formation of coatings of IMD layer deposition material over surfaces within the processing chamber. The formation of residual deposition material becomes a problem in subsequent depositions in several respects including flaking off of the residual deposition material onto the process wafer during the deposition process thereby introducing defects into a newly deposited layer, for example an IMD layer. In addition, the presence of dopants, such as fluorine in prior processes has tended to cause problems in subsequent depositions of non-doped IMD layers by undesirably introducing contaminants due to interaction of the deposition plasma with the residual deposition material within the chamber.

Therefore, the present disclosure provides a deposition apparatus with in-situ cleaning function. The deposition apparatus can be periodically cleaned to avoid the contamination of the substrates being processed. The deposition apparatus can be in situ cleaned using a gaseous cleaning agent, activated with the plasma.

FIG. 1 is a schematic view of a deposition apparatus, in accordance with some embodiments of the disclosure. The deposition apparatus 100 includes a reactor chamber 110 where a film of dielectric material deposits following a deposition process. For instance, the deposition apparatus 100 may perform chemical vapor deposition (CVD) processes, for example, plasma enhanced CVD (PECVD) processes or high density plasma CVD (HDP-CVD) processes, or atomic layer deposition (ALD) processes to deposit the dielectric material layers. The reactor chamber 110 has a chamber bottom 112, a chamber dome 114, and a plurality of chamber walls 116 connecting the chamber bottom 112 to the chamber dome 114. One or more slit valve openings 118 may be present through one or more chamber walls 116. The slit valve opening 118 permits a substrate, such as a wafer 122 to enter and exit the reactor chamber 110.

As illustrated in the figure, the reactor chamber 110 can be a cold wall reactor, the chamber walls 116 of the reactor chamber 110 are cold and usually less deposition occurs on the walls, eliminating the risk of particles breaking loose from the chamber walls 116. Furthermore, a low wall-temperature reduces the risk of contaminating vapor/wall reactions. Alternatively, the react chamber 110 can be a hot (heated) wall reactor. In the hot wall reactor chamber 110, the reactor tube is surrounded by a tube furnace, and the wafer 122 and the chamber walls 116 of the reactor chamber 110 have the same temperature. In addition to the film growth occurring on the wafer 122, film growth might thus take place on the inside of the chamber walls 116. With thicker films on the chamber walls 116, there is a risk that particles will break loose from chamber walls 116, fall down on the surface of the growing film, and introduce pinholes in it. There might also be a supply of contamination in this reactor type because of the reaction between the material of the reactor wall and the vapor.

The deposition apparatus 100 includes a wafer holder 120 disposed in the reactor chamber 110 for holding the wafer 122 thereon. The wafer holder 120 is disposed above the chamber bottom 112. The wafer 122 includes a semiconductor substrate, in which the semiconductor substrate is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The wafer 122 may also include various doped regions, dielectric features, or multilevel interconnects in the semiconductor substrate. The film of dielectric material is deposited on the surface of the wafer 122.

In some embodiments, the wafer holder 120 comprises a ceramic material. The wafer holder 120 is coupled by a shaft 124 to a lift mechanism (not shown). The shaft 124 may lower the wafer holder 120 to a transfer position to allow the wafer 122 entering the reactor chamber 110 to be placed on the wafer holder 120. The shaft 124 may raise the wafer holder 120 to a predetermined processing position. A deposition ring 126 circumscribes and shields the wafer holder 120 from unwanted deposition. The shaft 124 is coupled to a rotary mechanism (not shown). The wafer holder 120 can be rotated by the shaft 124, such that the film can be deposited more uniform on the wafer 122. The wafer holder 120 and the reactor chamber 110 are further connected to a heater 150, such that the reactor chamber 110, the wafer holder 120 and the wafer 122 thereon can be heated to a predetermined temperature during the deposition process.

The wafer 122 is held on the wafer holder 120 by using an electrostatic charge, a mechanical clamp, a vacuum clamp, or gravity. The wafer 122 on the wafer holder 120 can be heated by applying optical techniques (tungsten filament lamps, lasers), thermal radiation techniques, or by using susceptors and radio frequency (RF) induction heating. In some embodiments, the gas, such as helium, can be supplied to the back side of the wafer 122 from gas supply, to improve the heat transfer from wafer holder 120 to the wafer 122 and control deposition on wafer 122 backside.

The deposition apparatus 100 includes a gas dispenser. The gas dispenser includes a showerhead 130 for introduce reactant gas into the reactor chamber 110. The showerhead 130 is disposed at the chamber dome 114. The showerhead 130 is disposed at the chamber dome 114. The showerhead 130 is disposed opposite to the wafer holder 120. The showerhead 130 is connected to a reactant gas supply 140, and the reactant gas(es) are fed and dispensed into the reactor chamber 110 via the showerhead 130. The showerhead 130 may be made of aluminum.

The showerhead 130 includes a plurality of holes 132 for allowing the reactant gas passing through. In some embodiments, the reactant gasses utilized in oxide deposition include silane ($SiH_4$) and oxygen ($O_2$), and the silicon oxide layer is deposited on the surface of the wafer 122, or filling the trenches on the wafer 122. For example, the ratio of the $SiH_4$ to $O_2$ can be varied for forming dielectric layers with different properties, such as different index of reflectance. Alternatively, suitable dopants can be introduced into the reactor chamber 110. The deposition reactant gases can use other suitable gases for corresponding deposition process. The showerhead 130 is also connected to a carrier gas supply 142, such as hydrogen, nitrogen or argon.

The showerhead 130 is connected to the reactant gas supply 140 and the carrier gas supply 142 via a plurality of tubes 134. The gas inlets of the tubes 134 are respectively connected to the corresponding gas outlet of the reactant gas supply 140 or the carrier gas supply 142, and the gas outlets of the tubes 134 are led to the gas inlet of the showerhead 130. In some embodiments, the gas outlets of the tubes 134 can be led to the showerhead 130 individually. Namely, the gases, including the reactant gases and the carrier gas, are led to the showerhead 130 via independent tubes 134, and the reactant gases and the carrier gas are mixed within the showerhead 130. Alternatively, in some embodiments, the inlets of the tubes 134 are connected to the corresponding gas supplys 140 and 142, and the tubes 134 share one gas outlet. Namely, the tubes 134 are connected to the showerhead 130 via the common gas let, and the gases, including the reactant gases and the carrier gas, are mixed before entering the showerhead 130.

The deposition apparatus 100 further includes a plurality of valves 136 to control the amount and the ratio of the reactant gases and the carrier gas for being reacted in the reactor chamber 110. The valves 136 can be remote controlled by a controller (not shown).

The reactant gases at room temperature are stored in the reactant gas supply 140. After pressure regulation, the reactant gases flows are measured with, for instance, mass flow meters. However, some reactants are liquids or solids at room temperature, they have to be fed to the reactor chamber 110 in other ways. They can be admitted to the reactor chamber 110 by simply heating them above the boiling or sublimation point. The evaporation rate can be varied by varying the supply temperature and/or the dimensions of the capillary from the supplys. Another way of introducing these substances is to use an evaporator or sublimator and a carrier gas. When the evaporator is used, the carrier gas is bubbled through the liquid to be evaporated or flowed above its surface. The carrier gas picks up the liquid substance and transports it into the reactor chamber 110. The evaporation rate depends on the temperature of the liquid, the liquid level in the container, and the flow rate of the carrier gas. If two or more reactant liquids have to be used in the process, it is seldom possible to vaporize them in the same evaporator while maintaining the predetermined molar ratio since they normally have different vapor pressures.

One or more reactant gases are supplied to the interior of reactor chamber 110 from reactant gas supply 140 through the showerhead 130. The reactant gases flow through small holes 132 of the showerhead 130 and over the surface of the wafer 122. The RF power supplied by a RF power supply 128 is conducted to the wafer holder 120 via coils, while grounding the showerhead 130, or the RF power is conducted to the showerhead 130, while grounding the wafer holder 120. In some embodiments, possible conditions include 500 to 2000 Watts of radio frequency (RF) power, 5 to 100 mT of pressure, and/or 50° C. to 150° C. of temperature (as measured at the dome or chamber wall) in the reactor chamber 110, which produces an electromagnetic field between showerhead 130 and wafer holder 120. The electromagnetic field forms a plasma of the reactant gases flowing through holes 132 so that deposition may occur. For example, during parylene deposition RF power supply 124 is used to generate a plasma to deposit a parylene adhesion layer on the wafer 122. Once the parylene adhesion layer is generated, the RF power is turned off, and the remaining parylene deposition occurs.

The deposition apparatus 100 includes an exhaust system to exhaust the gas in the reactant chamber 110. In some embodiments, the exhaust system includes a purge gas supply 152 connected to a vent inlet of the reactor chamber 110, and a purge gas evacuation device 154 connected to a vent outlet of the reactor chamber 110. The purge gas supply 152 is utilized to provide purge gas to the reactor chamber 110, and the purge gas evacuation device 154 is utilized to evacuate the purge gas from the reactor chamber 110. The purge gas supply 152 includes a purge conduit which is provided in gas communication with the vent inlet of the reactor chamber 110, a purge valve 156 which may be manual or electric, is provided in the purge conduit for selectively allowing flow of the purge gas, such as clean, dry air, atmospheric air or nitrogen or other purge gas through the purge conduit and into the reactor chamber 110. The purge gas evacuation device 154 provides an evacuation of the reactor chamber 110 to replace the gas within the reactor chamber 110 with the purge gas. The purge gas evacuation device 154 includes an evacuation conduit connected to the vent outlet of the reactor chamber 110, and a vacuum pump. The purge gas collectively directs the processing gas to flow towards the vacuum pump. In some embodiments, the evacuation can be continued by the purge gas evacuation device 154 during boat-in/out (or wafer loading/unloading) processes for preventing the back-flow of the contaminations. In some embodiments, such as at reduced pressures, however, the vacuum pump as well as some kind of total pressure control have to be used so that a constant pressure is maintained within reactor chamber 110.

As a result of the processing of the wafer 122, contaminants are deposited on the interior surfaces of reactor chamber 110. Moreover, during certain types of processing, contaminants, such as residual polymer may be also deposited on the interior surfaces of showerhead 130. The interior surfaces of the showerhead 130 usually show a higher deposition rate than the reactor chamber 110 because the temperature of showerhead 130 is lower than the temperature of the chamber walls 116.

Periodically an in situ cleaning cycle is used to remove the contaminates within reactor chamber 110. The in situ cleaning cycle can be used when it is determined necessary by inspection contaminations, or may be performed at regular intervals. For instance, a method for dry etching of residual deposits in situ from a deposition apparatus is provided. Briefly, after removal of wafers, the reactor chamber 110 is closed off. The interior of the reactor chamber 110 is then filled with a gas and a plasma formed, after which oxygen is added and the reactor chamber 110 allowed to bake to an increased temperature for a period of time. The power is then turned off and the reactor chamber 110 evacuated. There is then followed a normal cleaning step employing a cleaning gas with greater cleaning efficiency due to the increased temperature caused by the bake step.

In some embodiments, after the deposition processes are completed, the wafer 122 is unloaded from reactor chamber 110, and the gas inside of the reactant chamber 110 is exhausted by the vacuum pump of the purge gas evacuation device 154. The reactor chamber 110 is baked for a period of time. The effect of pre-heating the reactor chamber 110 is to increase the efficiency of the cleaning process, so that quantities of cleaning gas and power are employed. Then, one or more cleaning gas(es) provided by a cleaning gas supply 160 are injected into the reactor chamber 110. The cleaning gas includes at least one gas selected from a group consisting of C, H, F, N, Cl, B, Br, and the combinations thereof. In some embodiments, the cleaning gas can be trifluoromethane ($CHF_3$), tetrafluoromethane ($CF_4$), boron trichloride ($BCl_3$), chlorine ($Cl_2$), ammonia ($NH_3$), bromine ($Br_2$), nitrogen trifluoride ($NF_3$) or the likes.

In some embodiments, the cleaning gas provided by the cleaning gas supply 160 can be injected into the reactor chamber 110 by the showerhead 130 as the reactant gas. In some embodiments, the cleaning gas can be injected into the reactor chamber 130 by conduits different from the reactant gas. Then, the cleaning gas is converted into a plasma state. That is, conditions within the process chamber are manipulated to convert the reactant gas into a plasma state. For example, possible conditions include 500 to 1800 Watts of radio frequency (RF) power, 10 to 170 Watts of power bias, 2 to 5 Torr of pressure, and/or 300° C. to 500° C. of temperature (as measured at the dome or chamber wall) in the process chamber. The cleaning gas can be trifluoromethane ($CHF_3$), tetrafluoromethane ($CF_4$), boron trichloride ($BCl_3$), chlorine ($Cl_2$), ammonia ($NH_3$), bromine ($Br_2$), nitrogen trifluoride ($NF_3$) or the likes, the cleaning gas is provided in a range of 5 sccm to 60 sccm. The carrier gas utilized in the plasma cleaning process can be Ar or N2, which is provided in a range of 20 sccm to 60 sccm. The total clean period of the plasma cleaning process is about 2 to 30 seconds.

If the cleaning gas is converted into the plasma under such conditions, a cleaning process may be performed relative to the inside of the reactor chamber 110. In the cleaning process, contaminations, such as residual polymers fixed to the inside of the process chamber are decomposed using the plasma particles. The decomposed polymer pieces are discharged out of the process chamber by exhaust system, thereby completing the cleaning process to the inside of the reactor chamber 110.

However, the showerhead 130 itself is made of aluminum, which can also be etched at the in situ plasma cleaning process. In some situations, not only the contaminations adhered on the reactor chamber 110 is removed at the in situ plasma cleaning process, but also a portion of the showerhead 130 surrounding the holes 132 may be removed during the plasma cleaning process. Such unwanted situation may extend the hole size of the holes 132 on the showerhead 130. The hole size of the showerhead 130 is varied after every cycle of plasma cleaning processes. The extending hole size of the showerhead 130 makes the gas flow stream become unstable, and controlling of the thickness of the deposition film on the wafer 122 becomes more difficult. The unstable thickness of the deposition film may cause device performance shift.

Therefore, the showerhead 130 of the present disclosure includes a surface treatment surface, such that the surface of the showerhead 130 is not etched during the plasma cleaning process, and the thickness of the deposition film can be stable even after the in situ plasma cleaning process.

Figure 2A:
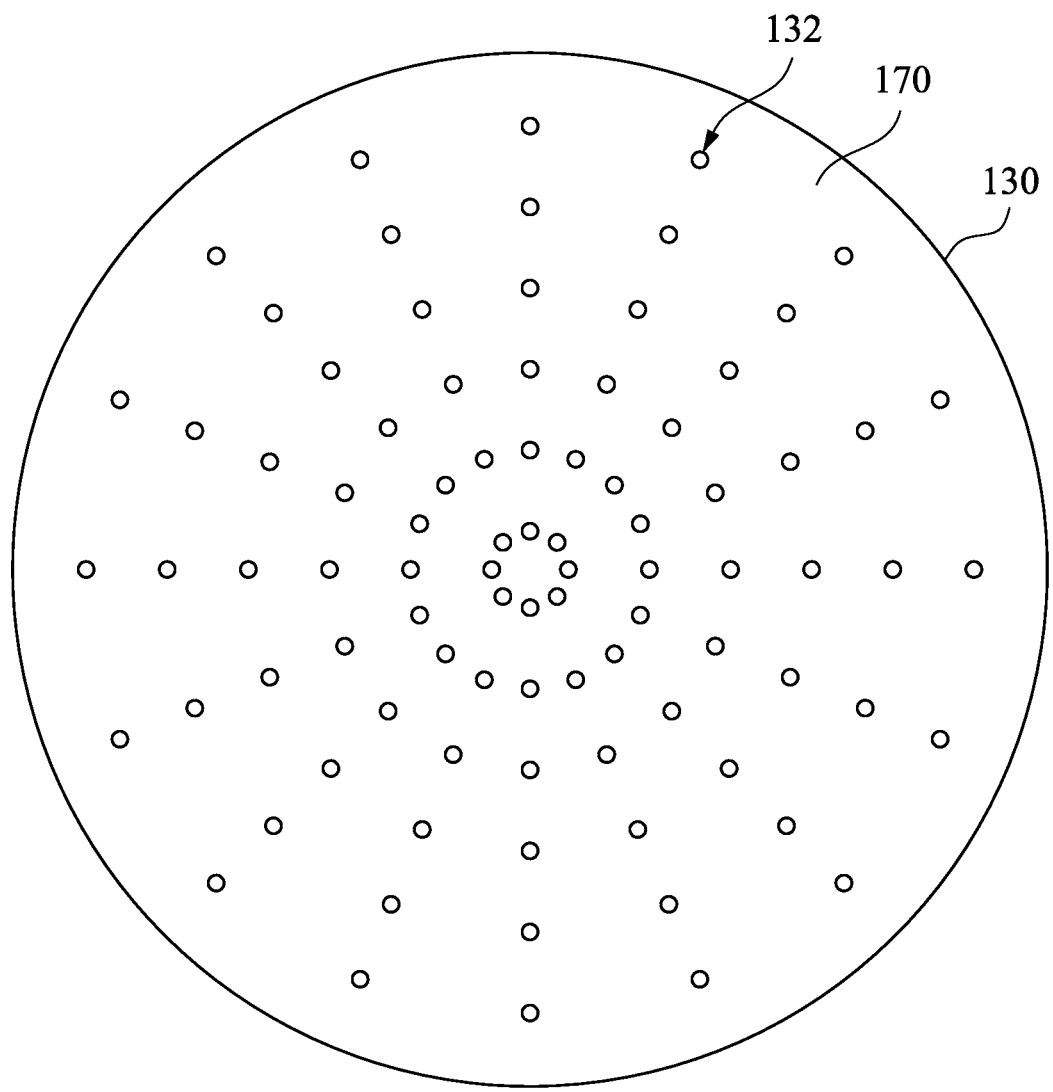
FIG. 2A is a front view of the showerhead 130 of some embodiments of the disclosure.
Figure 2B:
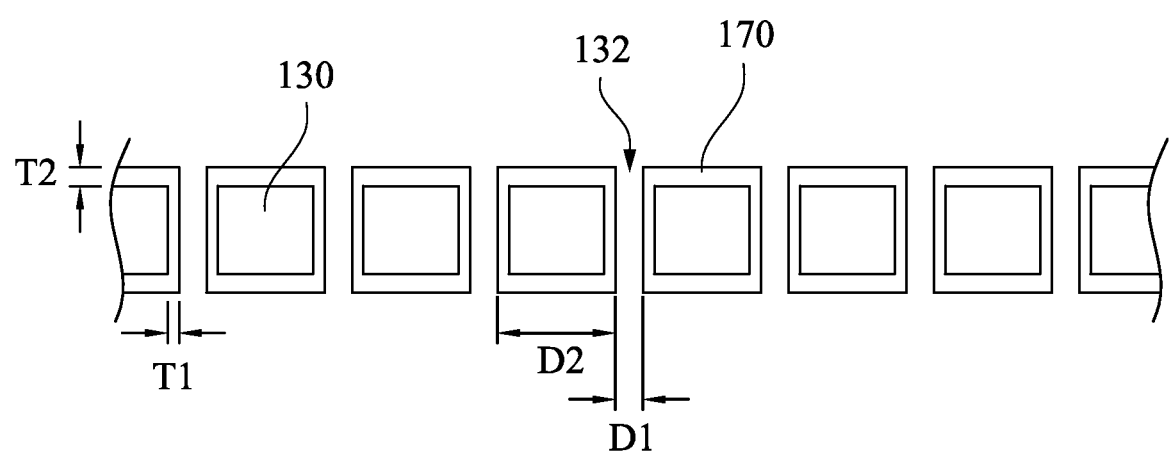
FIG. 2B is an enlarged cross-sectional view of the showerhead of some embodiments of the disclosure.

Reference is made to FIG. 2A and FIG. 2B, in which FIG. 2A is a front view of the showerhead 130 of some embodiments of the disclosure, and FIG. 2B is an enlarged cross-sectional view of the showerhead of some embodiments of the disclosure. The showerhead 130, the holes 132 of the showerhead 130 are typically arranged in a radial pattern, such design is utilized to mimic the shape of the wafer. The process gases, including the reactant gases, the carrier gas, and the cleaning gas, typically flow from the wafer center to the wafer edge.

The showerhead 130 coated with a mask layer 170 at the surface of the showerhead 130. The mask layer 170 shields the showerhead 130, such that the plasma can be isolated from the showerhead 130 during the plasma cleaning process, and the device shift issue caused by unstable thickness of the deposition film can be reduced. The holes 132 also penetrate through the mask layer 170, such that the gases may flow from through the holes 132.

The mask layer 170 is made of material which can be prevented from being etched during the plasma cleaning process. For instance, in some embodiments, the mask layer 170 can be fabricated by surface treatment of the showerhead 130, or in other embodiments, the mask layer 170 can be formed by coating a film on the showerhead 130.

In the embodiments of the mask layer 170 is formed by surface treatment, the showerhead 130 can be made of aluminum or aluminum alloy. In aluminum anodization processes, the aluminum oxide is grown down into the surface and out from the surface by equal amounts. The anodized aluminum layer is grown by passing a direct current through an electrolytic solution, with the aluminum object, i.e. the showerhead 130 serving as the anode (the positive electrode). The current releases hydrogen at the cathode (the negative electrode) and oxygen at the surface of the showerhead 130 as the aluminum anode, creating a build-up of aluminum oxide. Alternating current and pulsed current is also possible but rarely used. The voltage required by various solutions may range from 1 to 300 V DC, although most fall in the range of 15 to 21 V. Higher voltages are typically required for thicker coatings formed in sulfuric and organic acid. The anodizing current varies with the area of aluminum being anodized, and typically ranges from 30 to 300 amperes/meter$^2$ (2.8 to 28 ampere/ft$^2$).

In the embodiments, the mask layer 170 is formed by coating a film on the surface of the showerhead 130, the film can be formed by such as a deposition process. The film can be a nitride film. In some embodiments, the nitride film can be grown by several methods which include pulsed laser deposition, reactive molecular beam epitaxy, vacuum arc/cathodic arc deposition, DC/RF reactive sputtering, ion beam sputtering, metal-organic chemical vapor deposition (MOCVD), and other suitable techniques. The nitride film can be made of, but not be limited to aluminum nitride (AlN), titanium nitride (TiN), tantalum nitride (TaN), tungsten nitride (WN), molybdenum nitride (MoN), or the likes. In some embodiments, the film can be made of silicon carbide (SiC).

Reference is made to FIG. 2B. The mask layer 170 is formed on the sidewalls of the holes 132, the inner surface of the showerhead 130 which facing the chamber, and the outer surface of the showerhead 130 which facing the wafer holder. The diameter D1 of the holes 132 is from 0.4 mm to 0.6 mm, and the distance D2 between two adjacent holes 132, e.g. the width of the solid part between the holes 132, is from about 2 mm to 15 mm. The thickness of the mask layer 170 can be even. Alternatively, in some embodiments, the thickness of the mask layer 170 is different at different directions. For example, the thickness T1 of the mask layer 170 along the horizontal direction is in a range from 0.02 mm to 0.07 mm since the thickness T2 of the mask layer 170 along the vertical direction is in a range from 0.05 mm to 0.10 mm.

As a result, the mask layer 170 formed on the showerhead 130 can prevent the showerhead from being etched during the in situ plasma cleaning process in the deposition apparatus. Therefore, the problem caused by unstable thickness of the deposition film may be prevented.

In some embodiments of the disclosure, a deposition apparatus is provided. The deposition apparatus includes a reactor chamber, a holder disposed in the reactor chamber for holding a substrate, a showerhead disposed in the reactor chamber and opposite to the holder and having a plurality of holes for allowing reaction gasses entering the reactor chamber, and a mask layer formed on a surface of the showerhead for preventing the showerhead from being etched during a plasma cleaning process.

In some embodiment of the disclosure, a deposition apparatus with in situ plasma cleaning function is provided. The deposition apparatus includes a reactor chamber, a holder disposed in the reactor chamber for holder a substrate, a showerhead disposed at a chamber dome of the reactor chamber, a reactant gas supply connected to the showerhead for providing a reactant gas into the reactor chamber, a cleaning gas supply connected to the showerhead for providing a cleaning gas into the reactor chamber, a radio frequency (RF) power supply connected to the holder or the showerhead for generating a plasma between the holder and the showerhead, and a mask layer formed on the surface of the showerhead.

In some embodiments of the disclosure, a gas dispenser utilized in a deposition apparatus is provided. The gas dispenser includes a showerhead comprising a plurality of holes, and a mask layer formed on a surface of the showerhead, wherein the holes penetrate through the mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deposition apparatus, comprising:
a reactor chamber having a chamber dome and chamber walls supporting the chamber dome, wherein the chamber dome is curved from the chamber walls;
a holder disposed in the reactor chamber for holding a substrate;
an aluminum showerhead disposed in the chamber dome of the reactor chamber and opposite to the holder, the aluminum showerhead comprising a plurality of holes for allowing reaction gasses entering the reactor chamber, the aluminum showerhead further comprising a stem extending through the chamber dome, an upper portion coupled to the stem with a curved shape that is parallel with a curve of the chamber dome, and a lower portion including a showerhead plate that is flat, wherein the curve of the chamber dome has a bottommost position at a level height between a bottommost position of the curved shape of the upper portion of the aluminum showerhead and the showerhead plate;
a reactant gas supply connected to the stem of the aluminum showerhead via a first tube and configured to provide a reactant gas into the reactor chamber through the first tube, the stem, the upper portion, and the lower portion of the aluminum showerhead;
a cleaning gas supply connected to the aluminum showerhead via a second tube and configured to provide a cleaning gas into the reactor chamber through the second tube, the stem, the upper portion, and the lower portion of the aluminum showerhead, wherein the reactant and cleaning gas supplies are different gas supplies, wherein the cleaning gas is bromine ($Br_2$), and is introduced into the reactor chamber after exhausting a remainder of the reactant gas and heating the reactor chamber;

an anodized aluminum mask layer covering the showerhead plate, wherein the anodized aluminum mask layer is grown from anodizing an aluminum horizontal surface of the aluminum showerhead and anodizing aluminum vertical sidewalls in the plurality of holes of the aluminum showerhead, wherein the anodized aluminum mask layer grown from anodizing the aluminum vertical sidewalls in the plurality of holes of the aluminum showerhead remains in the plurality of holes of the aluminum showerhead when the aluminum showerhead is placed in the reactor chamber, and the anodized aluminum mask layer is configured for preventing the aluminum showerhead from being etched during a plasma cleaning process, wherein the anodized aluminum mask layer has vertical portions in the holes of the aluminum showerhead and horizontal portions on the aluminum horizontal surface of the aluminum showerhead, the vertical portions are perpendicular to the horizontal portions, and the vertical portions of the anodized aluminum mask layer in the holes of the aluminum showerhead are thinner than the horizontal portions of the anodized aluminum mask layer on the aluminum horizontal surface of the aluminum showerhead when the aluminum showerhead is placed in the reactor chamber;

a cleaning gas line downstream of the cleaning gas supply and extending to a first partial region of a gas inlet of the aluminum showerhead;

a reactant gas line downstream of the reactant gas supply and extending to a second partial region of the gas inlet of the aluminum showerhead separated from the first partial region of the gas inlet of the aluminum showerhead, wherein an entirety of the reactant gas line is separated from the cleaning gas line, wherein the reactant gas line comprises the first tube, the cleaning gas line comprises the second tube, wherein from a side view, the first tube and the second tube intersect with a top end of the stem at separated first and second regions on the top end of the stem, and guide the reactant gas and the cleaning gas to flow into the stem through the separated first and second regions on the top end;

a purge gas supply and a purge conduit connecting the purge gas supply to a vent inlet of the reactor chamber; and a purge gas evacuation device comprising a vacuum pump and an evacuation conduit connecting the vacuum pump to a vent outlet of the reactor chamber opposite to the vent inlet, wherein an upstream end of the purge conduit connecting the purge conduit and the purge gas supply at a first level height higher than a second level height of a topmost position of the holder, and a downstream end of the evacuation conduit connecting the evacuation conduit and the vacuum pump is also at the first level height higher than the second level height of the topmost position of the holder.

2. The deposition apparatus of claim 1, further comprising a carrier gas supply connected to the aluminum showerhead for providing a carrier gas into the reactor chamber.

3. The deposition apparatus of claim 2, wherein the carrier gas supply is connected to the stem of the aluminum showerhead via a third tube for providing the carrier gas into the reactor chamber through the third tube, the stem, the upper portion, and the lower portion of the aluminum showerhead, wherein from a side view, the third tube intersects with the top end of the stem at a third region separated from the first and second regions on the top end of the stem, and guides the carrier gas to flow into the stem through the third region separated from the first and second regions, wherein the first tube guiding the reactant gas is disposed horizontally between the second tube guiding the cleaning gas and the third tube guiding the carrier gas.

4. The deposition apparatus of claim 1, further comprising:

a first valve in the reactant gas line; and a second valve different from the first valve and in the cleaning gas line.

5. The deposition apparatus of claim 1, wherein the anodized aluminum mask layer is configured to facilitate removal of residual polymers deposited on the anodized aluminum mask layer.

6. The deposition apparatus of claim 1, wherein a bottommost position of the aluminum showerhead is lower than a bottommost position of the curve of the chamber dome.

7. The deposition apparatus of claim 1, wherein the purge conduit extends along a first straight line from the upstream end of the purge conduit to a downstream end of the purge conduit in the reactor chamber.

8. The deposition apparatus of claim 7, wherein the evacuation conduit extends along a second straight line from the downstream end of the evacuation conduit to an upstream end of the evacuation conduit in the reactor chamber.

9. The deposition apparatus of claim 8, wherein the upstream end and the downstream end of the purge conduit are horizontally aligned with the upstream end and the downstream end of the evacuation conduit, and the horizontal alignment is at the first level height higher than the second level height of the topmost position of the holder.

10. The deposition apparatus of claim 9, further comprising:

a heater connected with both the holder and the reactor chamber.

11. The deposition apparatus of claim 10, wherein the heater is connected with the reactor chamber at a third level height lower than the first level height where the upstream end and the downstream end of the purge conduit and the upstream end and the downstream end of the evacuation conduit are horizontally aligned.

12. The deposition apparatus of claim 11, wherein the third level height where the heater is connected with the reactor chamber is also lower than the second level height of the topmost position of the holder.

13. The deposition apparatus of claim 11, further comprising:

a radio frequency (RF) power supply connected with the holder at a fourth level height higher than the third level height where the heater is connected with the reactor chamber, but lower than the first level height where the upstream end and the downstream end of the purge conduit and the upstream end and the downstream end of the evacuation conduit are horizontally aligned.

14. The deposition apparatus of claim 13, wherein the heater is connected with the holder at a fifth level height level with the fourth level height where the RF power supply is connected with the holder.

15. The deposition apparatus of claim 1, wherein the anodized aluminum mask layer on the aluminum horizontal surface of the aluminum showerhead has a thickness in a range from 0.05 mm to 0.1 mm when the aluminum showerhead is placed in the reactor chamber.

16. The deposition apparatus of claim 1, wherein the chamber dome has a vertical sidewall below the curve of the chamber dome, and the vertical sidewall has a topmost position at a level height between the bottommost position of the curve shape of the upper portion of the aluminum showerhead and the showerhead plate.

17. The deposition apparatus of claim 1, wherein a horizontal distance between the bottommost position of the curve of the chamber dome and the bottommost position of the curved shape of the upper portion of the aluminum showerhead is more than twice a vertical distance between the curve of the chamber dome and the curved shape of the upper portion of the aluminum showerhead.

18. A deposition apparatus with in situ plasma cleaning function, the deposition apparatus comprising:
   a reactor chamber having a curved chamber dome, a chamber bottom, and chamber walls, wherein the curved chamber dome is an arc in a cross section and curved from the chamber walls, and the chamber walls vertically extend from the curved chamber dome to the chamber bottom;
   a holder disposed in the reactor chamber for holding a substrate;
   an aluminum showerhead disposed in the curved chamber dome of the reactor chamber, the aluminum showerhead comprising a stem extending through the curved chamber dome, a curved upper portion coupled to the stem that is parallel with the curved chamber dome, and a lower portion including a horizontal flat showerhead plate, wherein the curved upper portion is wholly disposed above a bottom of the curved chamber dome and the horizontal flat showerhead plate is wholly disposed below the bottom of the curved chamber dome, wherein the horizontal flat showerhead plate has a plurality of holes, a bottom horizontal surface facing the holder, and a top horizontal surface opposite the bottom horizontal surface, wherein a bottommost position of the aluminum showerhead is lower than a bottommost position of the curve of the curved chamber dome;
   a reactant gas supply connected to the stem of the aluminum showerhead via a first tube for providing a reactant gas into the reactor chamber through the first tube, the stem, the curved upper portion, and the lower portion of the aluminum showerhead;
   a cleaning gas supply connected to the aluminum showerhead via a second tube for providing a cleaning gas into the reactor chamber through the second tube, the stem, the curved upper portion, and the lower portion of the aluminum showerhead, wherein the reactant and cleaning gas supplies are different gas supplies, wherein the cleaning gas is boron trichloride ($BCl_3$) or chlorine ($Cl_2$), and is introduced into the reactor chamber after exhausting a remainder of the reactant gas and heating the reactor chamber;
   a radio frequency (RF) power supply connected to the holder or the aluminum showerhead for generating a plasma between the holder and the aluminum showerhead;
   an anodized aluminum mask layer covering the horizontal flat showerhead plate, wherein the anodized aluminum mask layer is formed by anodizing the top and bottom horizontal surfaces of the aluminum showerhead and anodizing aluminum vertical sidewalls in the plurality of holes of the aluminum showerhead, wherein the anodized aluminum mask layer formed by anodizing the aluminum vertical sidewalls in the plurality of holes of the aluminum showerhead remains in the plurality of holes of the aluminum showerhead when the aluminum showerhead is placed in the reactor chamber, and the anodized aluminum mask layer is configured not to be removed during a plasma cleaning process, wherein the anodized aluminum mask layer has vertical portions in the holes of the aluminum showerhead and horizontal portions on the top and bottom horizontal surfaces of the aluminum showerhead, the vertical portions are perpendicular to the horizontal portions, and the vertical portions of the anodized aluminum mask layer in the holes of the aluminum showerhead are thinner than the horizontal portions of the anodized aluminum mask layer on the top and bottom horizontal surfaces of the aluminum showerhead when the aluminum showerhead is placed in the reactor chamber;
   a cleaning gas line downstream of the cleaning gas supply and extending to a first partial region of a gas inlet of the aluminum showerhead;
   a reactant gas line downstream of the reactant gas supply and extending to a second partial region of the gas inlet of the aluminum showerhead separated from the first partial region of the gas inlet of the aluminum showerhead, wherein an entirety of the reactant gas line is separated from the cleaning gas line, wherein the reactant gas line comprises the first tube, the cleaning gas line comprises the second tube, wherein from a side view, the first tube and the second tube intersect with a top end of the stem at separated first and second regions on the top end of the stem, and guide the reactant gas and the cleaning gas to flow into the stem through the separated first and second regions on the top end;
   a purge gas supply and a purge conduit connecting the purge gas supply to a vent inlet of the reactor chamber; and
   a purge gas evacuation device comprising a vacuum pump and an evacuation conduit connecting the vacuum pump to a vent outlet of the reactor chamber opposite to the vent inlet, wherein an upstream end of the purge conduit connecting the purge conduit and the purge gas supply is at a first level height higher than a second level height of a topmost position of the holder, and a downstream end of the evacuation conduit connecting the evacuation conduit and the vacuum pump is also at the first level height higher than the second level height of the topmost position of the holder.

19. The deposition apparatus of claim 18, wherein a horizontal distance between a bottommost position of the curved chamber dome and a bottommost position of the curved upper portion of the aluminum showerhead is more than twice a vertical distance between the curved chamber dome and the curved upper portion of the aluminum showerhead.

20. The deposition apparatus of claim 18, further comprising:
   a carrier gas supply connected to the stem of the aluminum showerhead via a third tube for providing a carrier gas into the reactor chamber through the third tube, the stem, the curved upper portion, and the lower portion of the aluminum showerhead,
   wherein from a side view, the third tube intersects with the top end of the stem at a third region separated from the first and second regions on the top end of the stem, and guides the carrier gas to flow into the stem through the third region separated from the first and second regions, wherein the first tube guiding the reactant gas is disposed horizontally between the second tube guiding the cleaning gas and the third tube guiding the carrier gas.

\* \* \* \* \*